US011228727B2

(12) United States Patent
Okamoto et al.

(10) Patent No.: US 11,228,727 B2
(45) Date of Patent: Jan. 18, 2022

(54) IMAGING ELEMENT, DRIVING METHOD, AND ELECTRONIC EQUIPMENT

(71) Applicant: SONY SEMICONDUCTOR SOLUTIONS CORPORATION, Kanagawa (JP)

(72) Inventors: Ryuta Okamoto, Kanagawa (JP); Yosuke Ueno, Kanagawa (JP); Yasunori Tsukuda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 507 days.

(21) Appl. No.: 16/319,109

(22) PCT Filed: Jul. 21, 2017

(86) PCT No.: PCT/JP2017/026409
§ 371 (c)(1),
(2) Date: Jan. 18, 2019

(87) PCT Pub. No.: WO2018/025658
PCT Pub. Date: Feb. 8, 2018

(65) Prior Publication Data
US 2021/0337156 A1  Oct. 28, 2021

(30) Foreign Application Priority Data
Aug. 4, 2016  (JP) .............................. JP2016-153665

(51) Int. Cl.
*H04N 5/3745* (2011.01)
*H04N 5/357* (2011.01)
*H04N 5/363* (2011.01)

(52) U.S. Cl.
CPC ....... *H04N 5/37455* (2013.01); *H04N 5/3575* (2013.01); *H04N 5/363* (2013.01)

(58) Field of Classification Search
CPC ... H04N 5/37455; H04N 5/3575; H04N 5/363
(Continued)

(56) References Cited

U.S. PATENT DOCUMENTS 9,736,406 B2 * 8/2017 Kimura ................. H04N 5/378
2011/0074994 A1   3/2011 Wakabayashi et al.
(Continued)

FOREIGN PATENT DOCUMENTS

CN   102047563 A    5/2011
CN   102291543 A   12/2011
(Continued)

OTHER PUBLICATIONS

International Search Report and Written Opinion of PCT Application No. PCT/JP2017/026409, dated Oct. 10, 2017, 08 pages of ISRWO.

*Primary Examiner* — Lin Ye
*Assistant Examiner* — Chan T Nguyen
(74) *Attorney, Agent, or Firm* — Chip Law Group

(57) ABSTRACT

The present disclosure relates to an imaging element, a driving method, and electronic equipment that enable imaging to be performed at higher speed. The imaging element includes a pixel array in which a plurality of pixels are arranged in a matrix shape, an AD converter that performs AD conversion in parallel on pixel signals that have been output from the plurality of pixels for each column of the plurality of pixels arranged in the pixel array, and a reference signal generator that generates a reference signal that the AD converter refers to when the AD converter performs AD conversion on a pixel signal for an identical pixel signal, the reference signal having a waveform that includes a slope having a constant gradient. Then, when the AD converter performs, on the identical pixel signal, multi-sampling for performing sampling during a P-phase period and sampling during a D-phase period at least once or more, the reference signal generator generates a reference signal in which, from among a plurality of slopes during the D-phase period, a sampling period of a second slope has been set to be shorter than a sampling period of a first slope. The present technol- (Continued)

ogy is applicable, for example, to a CMOS image sensor including a column-parallel ADC.

15 Claims, 10 Drawing Sheets

(58) Field of Classification Search
USPC .......................................................... 348/294
See application file for complete search history.

(56) References Cited

U.S. PATENT DOCUMENTS

| | | |
|---|---|---|
| 2011/0304755 A1 | 12/2011 | Kondo |
| 2014/0160334 A1 | 6/2014 | Wakabayashi |
| 2017/0237917 A1* | 8/2017 | Sato ....................... H04N 5/363 348/308 |

FOREIGN PATENT DOCUMENTS

| | | | |
|---|---|---|---|
| CN | 103782587 A | 5/2014 | |
| EP | 2290823 A1 | 3/2011 | |
| EP | 2755379 A1 | 7/2014 | |
| JP | 2009-296423 A | 12/2009 | |
| JP | 2009296423 * | 12/2009 | ............. H03M 1/56 |
| JP | 2012-004727 A | 1/2012 | |
| JP | 2013-055589 A | 3/2013 | |
| WO | 2009/148107 A1 | 12/2009 | |
| WO | 2013/035616 A1 | 3/2013 | |

* cited by examiner

DIM : (D1+D2) − (P1+P2)
BRIGHT1: D2 − (P1+P2)/2
BRIGHT2: D2 − P2

DIM : (D1+D2+D3+D4) − (P1+P2+P3+P4)
BRIGHT1: D4 − (P1+P2+P3+P4)/4
BRIGHT2: D4 − P4

IMAGING ELEMENT, DRIVING METHOD, AND ELECTRONIC EQUIPMENT

CROSS REFERENCE TO RELATED APPLICATIONS

This application is a U.S. National Phase of International Patent Application No. PCT/JP2017/026409 filed on Jul. 21, 2017, which claims priority benefit of Japanese Patent Application No. JP 2016-153665 filed in the Japan Patent Office on Aug. 4, 2016. Each of the above-referenced applications is hereby incorporated herein by reference in its entirety.

TECHNICAL FIELD

The present disclosure relates to an imaging element, a driving method, and electronic equipment, and in particular, an imaging element, a driving method, and electronic equipment that enable imaging to be performed at higher speed.

BACKGROUND ART

Conventionally, in electronic equipment having an imaging function, such as a digital still camera or a digital video camera, a solid-state imaging element such as a charge coupled device (CCD) or a complementary metal oxide semiconductor (CMOS) image sensor, for example, is used. The solid-state imaging element includes a pixel in which a photodiode (PD) that performs photoelectric conversion and a plurality of transistors are combined, and an image is constructed on the basis of pixel signals that have been output from a plurality of pixels that are arranged on an image plane on which an image of a subject is formed.

Furthermore, the CMOS image sensor can realize high-speed AD conversion performed on a pixel signal by using a column-parallel single-slope analog-to-digital converter (ADC) to compare a pixel signal output from a pixel with a reference signal of a single slope and perform processing for performing AD conversion on the pixel signal in parallel for each column. Moreover, the CMOS image sensor can reduce noise generated in the pixel signal, by performing AD conversion processing on the same pixel signal a plurality of times (multi-sampling) by using the column-parallel single-slope ADC.

For example, Patent Document 1 discloses a solid-state imaging apparatus that can reduce random noise such as quantization noise or circuit noise in AD conversion by performing digital integration processing for repeatedly performing n-bit AD conversion processing on a signal to be processed twice or more.

CITATION LIST

Patent Document

Patent Document 1: Japanese Patent Application Laid-Open No. 2009-296423

SUMMARY OF THE INVENTION

Problems to be Solved by the Invention

Meanwhile, in recent years, the speeding-up of imaging using the CMOS image sensor has been attempted. Accordingly, it has been requested that the processing time of AD conversion processing performed on a pixel signal by multi-sampling be reduced and imaging be performed at higher speed The present disclosure has been made in view of the situation described above, and enables imaging to be performed at higher speed.

Solutions to Problems

An imaging element in one aspect of the present disclosure includes: a pixel array in which a plurality of pixels are arranged in a matrix shape; an analog-to-digital (AD) converter that performs AD conversion in parallel on pixel signals that have been output from the plurality of pixels for each column of the plurality of pixels arranged in the pixel array; and a reference signal generator that generates a reference signal that the AD converter refers to when the AD converter performs the AD conversion on the pixel signals, the reference signal having a waveform that includes a slope having a constant gradient. When the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

A driving method in one aspect of the present disclosure is a driving method of an imaging element that includes: a pixel array in which a plurality of pixels are arranged in a matrix shape; an analog-to-digital (AD) converter that performs AD conversion in parallel on pixel signals that have been output from the plurality of pixels for each column of the plurality of pixels arranged in the pixel array; and a reference signal generator that generates a reference signal that the AD converter refers to when the AD converter performs the AD conversion on the pixel signals, the reference signal having a waveform that includes a slope having a constant gradient. When the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

Electronic equipment in one aspect of the present disclosure includes: a pixel array in which a plurality of pixels are arranged in a matrix shape; an analog-to-digital (AD) converter that performs AD conversion in parallel on pixel signals that have been output from the plurality of pixels for each column of the plurality of pixels arranged in the pixel array; and a reference signal generator that generates a reference signal that the AD converter refers to when the AD converter performs the AD conversion on the pixel signals, the reference signal having a waveform that includes a slope having a constant gradient. When the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

In one aspect of the present disclosure, when multi-sampling is performed on an identical pixel signal of the pixel signals, the multi-sampling being processing for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, the reference signal is generated in which, from among a plurality of slopes during the D-phase period, a sampling period of a second slope other than a first slope has been set to be shorter than a sampling period of the first slope, the sampling period of the second slope being a sampling period having a prescribed length.

Effects of the Invention

In one aspect of the present disclosure, imaging can be performed at higher speed.

MODE FOR CARRYING OUT THE INVENTION

Specific embodiments to which the present technology has been applied are described below in detail with reference to the drawings.

<First Configuration Example of Imaging Element>

Figure 1:
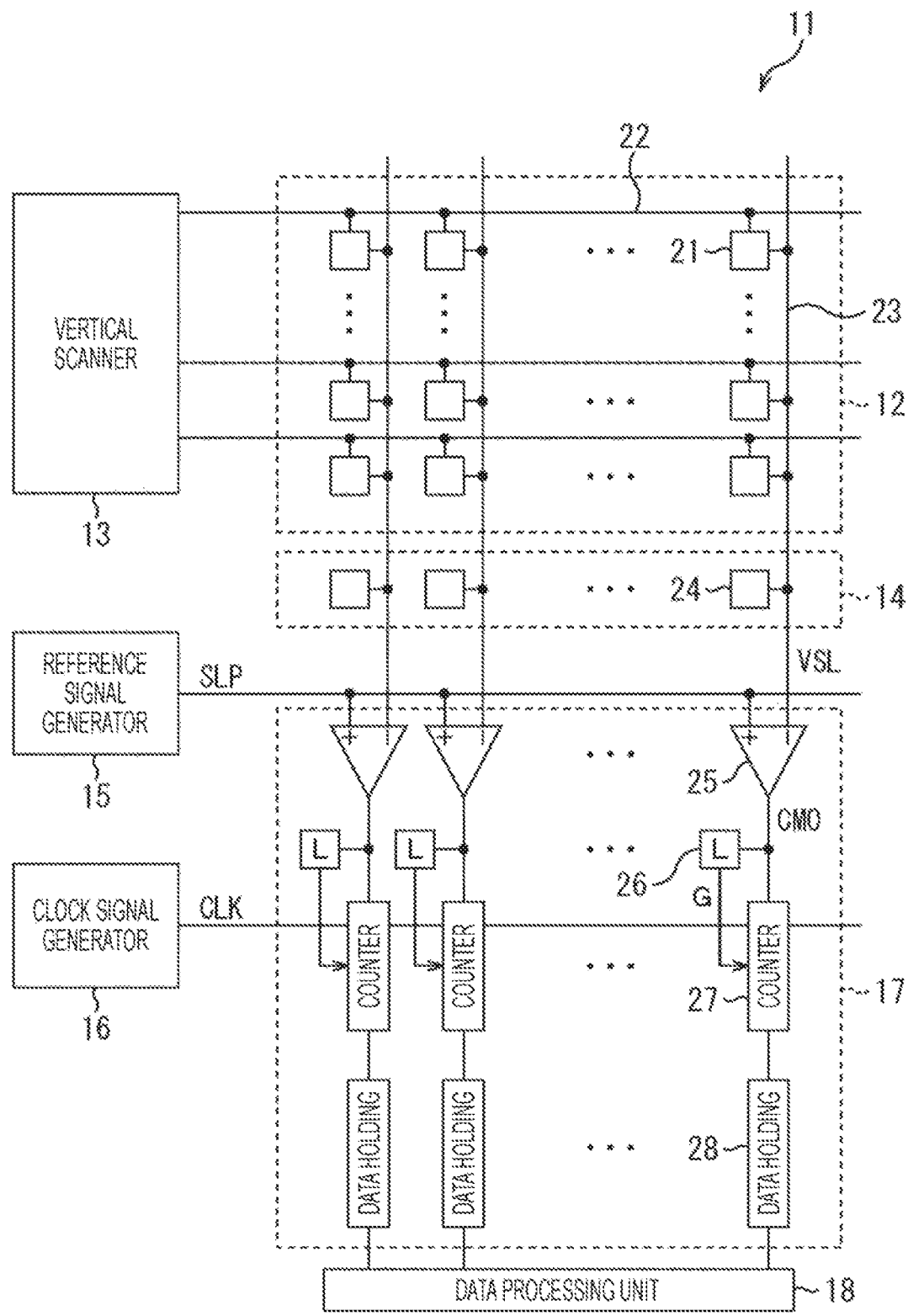
FIG. 1 is a block diagram illustrating a configuration example according to a first embodiment of an imaging element to which the present technology has been applied.

FIG. 1 is a block diagram illustrating a configuration example according to a first embodiment of an imaging element to which the present technology has been applied.

In FIG. 1, an imaging element 11 includes a pixel array 12, a vertical scanner 13, a reading current controller 14, a reference signal generator 15, a clock signal generator 16, a column-parallel ADC 17, and a data processing unit 18.

The pixel array 12 is a light receiving surface that receives light condensed by a not-illustrated optical system. In the pixel array 12, a plurality of pixels 21 are arranged in a matrix shape. Each of the rows of the plurality of pixels 21 is connected to the vertical scanner 13 via a horizontal signal line 22, and each of the columns of the plurality of pixels 21 is connected to the column-parallel ADC 17 via a vertical signal line 23. Each of the plurality of pixels 21 outputs a pixel signal having a level that corresponds to an amount of received light, and an image of a subject that is formed on the pixel array 12 is constructed from the pixel signals.

The vertical scanner 13 sequentially supplies various drive signals for driving the respective pixels 21 to each of the rows of the plurality of pixels 21 that are arranged in the pixel array 12 via the horizontal signal line 22. For example, the vertical scanner 13 outputs a transfer signal that transfers a charge that has been generated in a PD of the pixel 21 to a floating diffusion (FD) unit, a reset signal that resets charges accumulated in the PD and the FD unit, a selection signal that selects the pixels 21 to be connected to the vertical signal line 23, and the like.

The reading current controller 14 includes a current source circuit 24 that is connected to the vertical signal line 23 for each of the columns of the pixels 21 of the pixel array 12, and controls a current for reading the pixel signal from the pixel 21. Then, the pixel signal that has been read from the pixel 21 by the reading current controller 14 is supplied as a potential VSL of the vertical signal line 23 to the column-parallel ADC 17.

The reference signal generator 15 generates a reference signal SLP that has a waveform including a slope having a constant gradient and that the column-parallel ADC 17 compares with the potential VSL of the vertical signal line 23 when performing AD conversion on the pixel signal, and the reference signal generator 15 supplies the reference signal SLP to the column-parallel ADC 17.

The clock signal generator 16 generates a clock signal CLK that has a prescribed clock frequency and that the column-parallel ADC 17 uses to sample the potential VSL of the vertical signal line 23 when performing AD conversion on the pixel signal, and the clock signal generator 16 supplies the clock signal CLK to the column-parallel ADC 17.

The column-parallel ADC 17 performs correlated double sampling (CDS) processing on the pixel signals that have been output from the plurality of pixels 21 via the vertical signal line 23 so as to perform AD conversion on the pixel signals in column-parallel and to remove reset noise.

For example, the column-parallel ADC 17 outputs a difference between a counter value (a P-phase) obtained by sampling a potential VSL of the vertical signal line 23 at a reset level of the pixel 21 and a counter value (a D-phase) obtained by sampling a potential VSL of the vertical signal line 23 at a level that corresponds to an amount of light received by the pixel 21, as pixel value data obtained by performing AD conversion on an analog pixel signal. At this time, the column-parallel ADC 17 can switch the number of samplings in which sampling is performed in the D-phase between a case where light received by the pixel 21 is bright and a case where light received by the pixel 21 is dim (not bright), as described later with reference to FIGS. 2A, 2B, 3A, and 3B.

Furthermore, the column-parallel ADC 17 includes a prescribed number of sets of a comparator 25, a signal determination latch 26, a counter 27, and a data holding latch 28 that corresponds to the number of columns of the pixels 21 of the pixel array 12, as illustrated. Note that the comparator 25, the signal determination latch 26, the counter 27, and the data holding latch 28 are configured similarly for each of the columns of the pixels 21, and processing in a certain single column is described below.

The comparator 25 compares the pixel signal that has been supplied from the pixel 21 via the vertical signal line 23 with the reference signal SLP that has been supplied from the reference signal generator 15, and outputs a comparison result signal CMO indicating a result of the comparison above. For example, the comparator 25 outputs a comparison result signal CMO indicating an L-level when the potential VSL of the vertical signal line 23 is greater than or equal to the reference signal SLP, and the comparator 25 outputs a comparison result signal CMO indicating an H-level when the potential VSL of the vertical signal line 23 is less than the reference signal SLP.

The signal determination latch 26 determines whether or not light received by the pixel 21 is bright, and holds a result of the determination above. In other words, the signal determination latch 26 holds a 1-bit determination signal G according to the level of the comparison result signal CMO at a determination timing at which the magnitude of the amplitude of the potential VSL of the vertical signal line 23 is determined, and reports the determination signal G to the counter 27.

For example, in a case where light received by the pixel 21 is dim, the comparator 25 outputs an L-level comparison result signal CMO at the determination timing (see, for example, FIG. 2A described later). In this case, the signal determination latch 26 holds an L-level determination signal G that indicates processing for setting the number of samplings in the D-phase to be the same as the number of samplings in the P-phase. On the other hand, in a case where light received by the pixel 21 is bright, the comparator 25 outputs an H-level comparison result signal CMO at the determination timing (see, for example, FIG. 2B described later). In this case, the signal determination latch 26 holds an H-level determination signal G that indicates processing for setting the number of samplings in the D-phase to be one.

The counter 27 counts the clock signal CLK supplied from the clock signal generator 16 so as to obtain a counter value obtained by sampling the potential VSL of the vertical signal line 23, and causes the data holding latch 28 to hold the counter value. For example, the counter 27 counts down a potential VSL of the vertical signal line 23 in the P-phase so as to obtain a counter value P in the P-phase, and counts up a potential VSL of the vertical signal line 23 in the D-phase so as to obtain a counter value D in the D-phase. Furthermore, the counter 27 can perform multi-sampling for sampling the potential VSL of the vertical signal line 23 a plurality of times in each of the P-phase and the D-phase.

At this time, the counter 27 can perform sampling while switching the number of samplings in the D-phase in accordance with the determination signal G held by the signal determination latch 26, as described later with reference to FIGS. 2A, 2B, 3A and 3B.

The data holding latch 28 holds pixel value data that has been obtained by the counter 27, and appropriately supplies the pixel value data to the data processing unit 18. For example, the data holding latch 28 holds a counter value P in the P-phase that has been obtained by counting-down, and thereafter, when a counter value D in the D-phase that has been obtained by counting-down is supplied, the data holding latch holds a difference between them as pixel value data (=D-P).

The data processing unit 18 reads the pixel value data held by the data holding latch 28, performs various types of data processing, such as noise removal processing or movement detection processing, that use pieces of pixel value data of an adjacent plurality of pixels 21, for example, and outputs a result to a not-illustrated image processing circuit in a rear stage.

The imaging element 11 is configured as described above, and can reduce random noise such as quantization noise or circuit noise in AD conversion by performing multi-sampling in the column-parallel ADC 17.

Then, the imaging element 11 can switch processing for performing the same number of samplings in the D-phase as the number of samplings in the P-phase and processing for performing sampling in the D-phase only once (less than the number of samplings in the P-phase) in accordance with the brightness of light received by the pixel 21. By doing this, the imaging element 11 can reduce a sampling time required in sampling in the D-phase, in other words, can reduce a processing time of AD conversion processing performed on the pixel signal, as described later with reference to FIGS. 2A, 2B, 3A, and 3B, and can perform imaging at higher speed. Furthermore, the imaging element 11 can adaptively determine the brightness of light received by the pixels 21 for each of the columns of the pixels 21.

Note that the imaging element 11 may employ, for example, a configuration in which the column-parallel ADC 17 does not include the data holding latch 28. In this case, the counter value P in the P-phase and the counter value D in the D-phase that have been output from the counter 27 are directly supplied to the data processing unit 18, and the data processing unit 18 performs an arithmetic operation to obtain pixel value data (=D-P).

<First Driving Method>

A first driving method of the imaging element 11 is described with reference to FIGS. 2A and 2B. Note that, in the first driving method, processing is performed for obtaining the pixel value data by using a value obtained by adding counter values in the P-phase that have been obtained by multi-sampling (in the example of FIGS. 2A and 2B, two samplings), and hereinafter, processing for obtaining the pixel value data according to the first driving method is appropriately referred to as P-phase adding processing.

The reference signal generator 15 generates a reference signal SLP that includes a first P-phase slope, a second P-phase slope, a determination-level potential, a first D-phase slope, and a second D-phase slope. In other words, as illustrated in FIG. 2A and FIG. 2B, during a P-phase period, the reference signal generator 15 generates a first P-phase slope that rises at a constant gradient, and then generates a second P-phase slope that falls at a constant gradient. Then, the reference signal generator 15 maintains a constant determination-level potential for determining the magnitude of the amplitude of the potential VSL of the vertical signal line 23 during a period between the P-phase period and a D-phase period. Thereafter, during the D-phase period, the reference signal generator 15 generates a first D-phase slope that rises at a constant gradient, and then generates a second D-phase slope that falls at a constant gradient.

Furthermore, the clock signal generator 16 generates a clock signal CLK having a prescribed clock frequency during a period that corresponds to each of the first P-phase slope, the second P-phase slope, the first D-phase slope, and the second D-phase slope.

Here, the reference signal SLP generated by the reference signal generator 15 and the clock signal generator 16 have the same waveform regardless of the magnitude of the amplitude of the potential VSL of the vertical signal line 23.

Figure 2A:
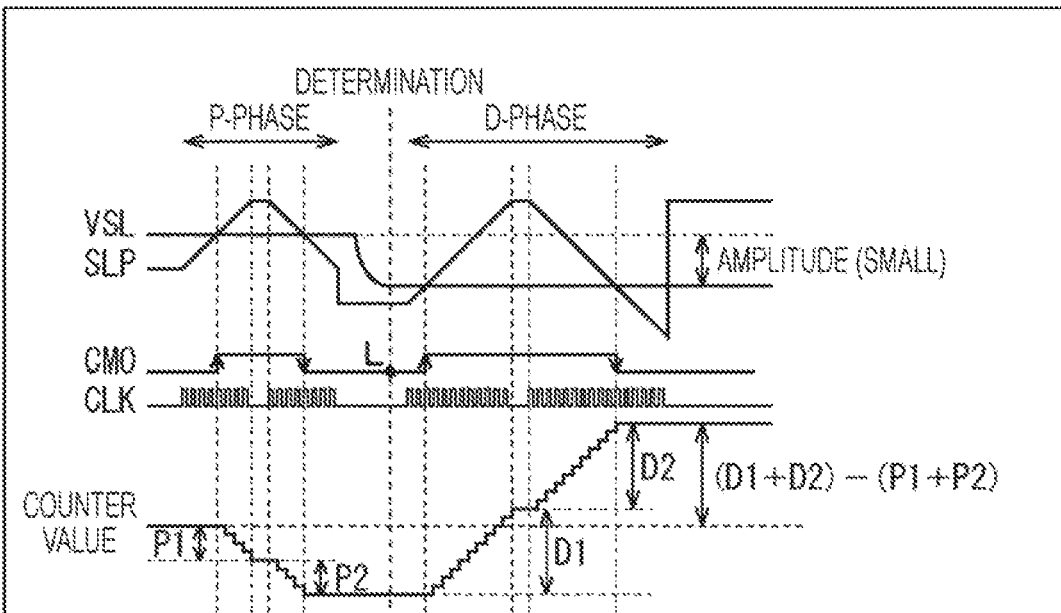
FIGS. 2A and 2B are diagrams explaining a first driving method of the imaging element.

Then, in the imaging element 11, in a case where light received by the pixel 21 is dim, the amplitude of the potential VSL of the vertical signal line 23 becomes small, as illustrated in FIG. 2A. On the other hand, in a case where light received by the pixel 21 is bright, the amplitude of the potential VSL of the vertical signal line 23 becomes large, as illustrated in FIG. 2B. Here, the amplitude of the potential VSL of the vertical signal line 23 indicates a difference between a reset level and a signal level of the pixel signal output from the pixel 21, and corresponds to an amount of light received by the pixel 21.

Furthermore, in the imaging element 11, after the P-phase period, the potential VSL of the vertical signal line 23 changes in accordance with the transfer of a charge generated in the PD of the pixel 21 to the FD unit, and the magnitude of the amplitude of the potential VSL of the vertical signal line 23 is determined at a timing at which the potential VSL of the vertical signal line 23 becomes stable.

Accordingly, in a case where light received by the pixel 21 is dim, the potential VSL of the vertical signal line 23 becomes greater than or equal to the reference signal SLP at the determination timing, as illustrated in FIG. 2A, and the comparator 25 outputs the L-level comparison result signal CMO. In this case, the signal determination latch 26 holds an L-level determination signal G that indicates processing for setting the number of samplings in the D-phase to be the same as the number of samplings in the P-phase.

Figure 2B:
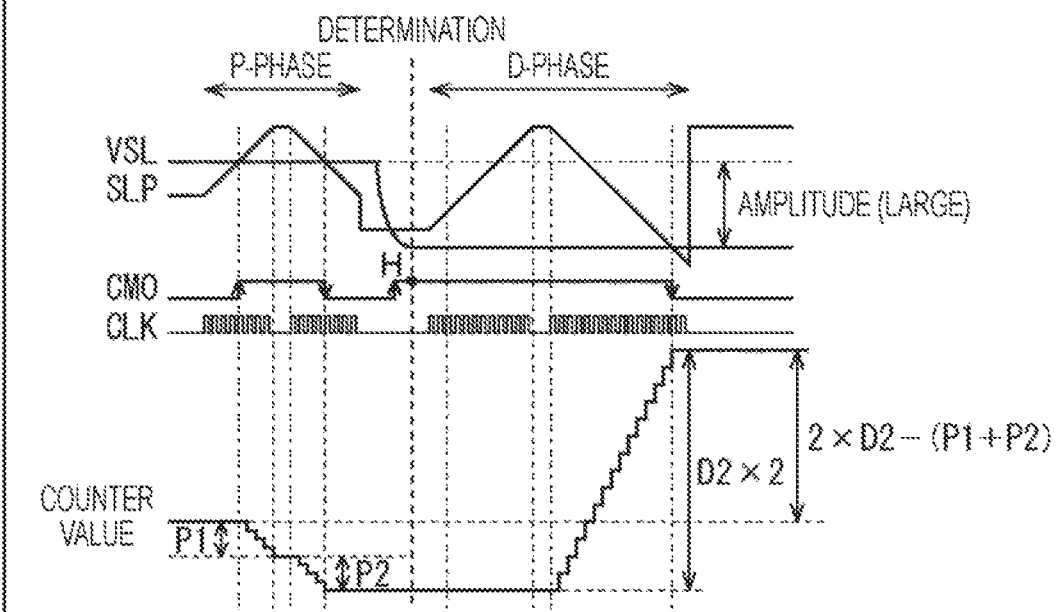

On the other hand, in a case where light received by the pixel 21 is bright, the potential VSL of the vertical signal line 23 becomes less than the reference signal SLP at the determination timing, as illustrated in FIG. 2B, and the comparator 25 outputs the H-level comparison result signal CMO. In this case, the signal determination latch 26 holds an H-level determination signal G that indicates processing for setting the number of samplings in the D-phase to be one.

First, operations of the comparator 25 and the counter 27 in a case where light received by the pixel 21 is dim and the amplitude of the potential VSL of the vertical signal line 23 is small are described with reference to FIG. 2A.

In the P-phase, at a timing at which a reference signal SLP having the first P-phase slope rises at a constant gradient to become greater than or equal to a potential VSL of the reset level of the vertical signal line 23, the comparison result signal CMO output from the comparator 25 is switched from the L-level to the H-level. Accordingly, from this timing to the end of the first P-phase slope, the counter 27 performs counting-down and samples the potential VSL of the vertical signal line 23, obtains a counter value P1 in a first P-phase, and causes the data holding latch 28 to hold the counter value P1.

Next, at a timing at which a reference signal SLP having the second P-phase slope falls at a constant gradient to become less than the potential VSL of the reset level of the vertical signal line 23, the comparison result signal CMO output from the comparator 25 is switched from the H-level to the L-level. Accordingly, from the start of the second P-phase slope to this timing, the counter 27 performs counting-down and samples the potential VSL of the vertical signal line 23, obtains a counter value P2 in a second P-phase, and causes the data holding latch 28 to hold the counter value P2.

Then, in a case where light received by the pixel 21 is dim, the comparison result signal CMO output from the comparator 25 has the L-level, and the L-level determination signal G is held in the signal determination latch 26. Accordingly, the counter 27 performs processing for setting the number of samplings in the D-phase to be the same as the number of samplings in the P-phase.

Thereafter, in the D-phase, at a timing at which a reference signal SLP having the first D-phase slope rises at a constant gradient to become greater than or equal to a potential VSL of the signal level of the vertical signal line 23, the comparison result signal CMO output from the comparator 25 is switched from the L-level to the H-level. Accordingly, from this timing to the end of the first D-phase slope, the counter 27 performs counting-up and samples the potential VSL of the vertical signal line 23, obtains a counter value D1 in a first D-phase, and causes the data holding latch 28 to hold the counter value D1.

Next, at a timing at which a reference signal SLP having the second D-phase slope falls at a constant gradient to become less than the potential VSL of the signal level of the vertical signal line 23, the comparison result signal CMO output from the comparator 25 is switched from the H-level to the L-level. Accordingly, from the start of the second D-phase slope to this timing, the counter 27 performs counting-up and samples the potential VSL of the vertical signal line 23, obtains a counter value D2 in a second D-phase, and causes the data holding latch 28 to hold the counter value D2.

As described above, in a case where light received by the pixel 21 is dim, the counter 27 performs each of sampling in the P-phase and sampling in the D-phase twice. Then, in the data holding latch 28, pixel value data (=(D1+D2)−(P1+P2)) is obtained in such a manner that a value obtained by adding the counter value P1 in the first P-phase and the counter value P2 in the second P-phase is subtracted from a value obtained by adding the counter value D1 in the first D-phase and the counter value P2 in the second D-phase.

Next, operations of the comparator 25 and the counter 27 in a case where light received by the pixel 21 is bright and the amplitude of the potential VSL of the vertical signal line 23 is large are described with reference to FIG. 2B.

Here, in the P-phase, the comparator 25 and the counter 27 perform operations that are similar to operations in a case where the amplitude of the potential VSL of the vertical signal line 23 is small, and therefore the description thereof is omitted.

Then, in a case where light received by the pixel 21 is bright, the potential VSL of the vertical signal line 23 becomes less than the reference signal SLP during a period between the P-phase period and the D-phase period. Therefore, at a timing at which the potential VSL of the vertical signal line 23 becomes less than the reference signal SLP, the comparison result signal CMO output from the comparator 25 is switched from the L-level to the H-level, and the H-level determination signal G is held in the signal determination latch 26. Accordingly, the counter 27 performs processing for setting the number of samplings in the D-phase to be one.

In other words, the counter 27 stops counting during a period in which the reference signal SLP has the first D-phase slope, and does not sample the potential VSL of the vertical signal line 23, and a current counter value is maintained in the data holding latch 28. Then, when the second D-phase slope starts, the counter 27 starts counting-up using a counter width that is twice the counter width of counting-down in the P-phase.

Thereafter, at a timing at which the reference signal SLP having the second D-phase slope falls at a constant gradient to become less than the potential VSL of the signal level of the vertical signal line 23, the comparison result signal CMO output from the comparator 25 is switched from the H-level to the L-level. Accordingly, from the start of the second D-phase slope to this timing, the counter 27 performs counting-up using a double counting-up width and samples the potential VSL of the vertical signal line 23, obtains the counter value D2 in the second D-phase, and causes the data holding latch 28 to hold the counter value D2.

As described above, in a case where light received by the pixel 21 is bright, the counter 27 performs sampling in the P-phase twice and performs sampling in the D-phase once. Then, in the data holding latch 28, pixel value data (=2× D2−(P1+P2)) is obtained in such a manner that a value obtained by adding the counter value P1 in the first P-phase and the counter value P2 in the second P-phase is subtracted from a value obtained by doubling the counter value D2 in the second D-phase.

As described above, the imaging element 11 switchingly performs processing for performing the same number of samplings in the D-phase as the number of samplings in the P-phase and processing for performing sampling in the D-phase only once in accordance with the brightness of light received by the pixel 21 in the first driving method.

Here, in a case where light received by the pixel 21 is bright, in other words, in a case where the amplitude of the potential VSL of the vertical signal line 23 is large, it is requested that a sampling period required in sampling in the D-phase be increased. In other words, in this case, the sampling period in the D-phase is set to a time period required to perform AD conversion on a pixel signal at a time when the pixel 21 receives bright light (a potential VSL having a large amplitude).

On the other hand, in a case where light received by the pixel 21 is dim, in other words, in a case where the amplitude of the potential VSL of the vertical signal line 23 is small, the sampling period required in sampling in the D-phase may be shorter than a sampling period in a case where light received by the pixel 21 is bright. In other words, in this case, the sampling period in the D-phase is set to a time period required to perform AD conversion on a pixel signal at a time when the pixel 21 receives dim light (a potential VSL having a small amplitude). By doing this, the imaging element 11 can set a period of the first D-phase slope to be shorter than a conventional period.

In other words, in the imaging element 11, in the first D-phase slope, only a potential VSL having a small amplitude of the vertical signal line 23 is sampled (FIG. 2A), and a potential VSL having a large amplitude of the vertical signal line 23 is not sampled (FIG. 2B). Accordingly, the imaging element 11 can set the period of the first D-phase slope to a minimum time period required to sample the potential VSL having a small amplitude of the vertical signal line 23.

As described above, the imaging element 11 can reduce the sampling period in the D-phase in comparison with the conventional period when multi-sampling is performed in the column-parallel ADC 17, and therefore the imaging element 11 can reduce a processing time as a whole of AD conversion processing that is required to perform multi-sampling. This enables the imaging element 11 to perform imaging at higher speed.

Furthermore, in the first driving method, pixel value data is obtained by using a value obtained by adding counter values in the P-phase, and therefore, pixel value data having a signal/noise (S/N) ratio that is more satisfactory than an S/N ratio in a second driving method can be obtained, for example.

Note that, in the first driving method illustrated in FIGS. 2A and 2B, by performing sampling twice, sampling using a counter width that is twice the counter width in the P-phase is performed by using the second D-phase slope. In contrast, for example, in a case where sampling is performed four times, sampling using a counter width that is four times the counter width in the P-phase, in other words, a prescribed integral multiple of the counter width that corresponds to the number of multi-samplings, is performed by using the second D-phase slope.

<Second Driving Method>

A second driving method of an imaging element is described with reference to FIGS. 3A and 3B. Note that, in the second driving method, processing is performed for obtaining pixel value data by using a mean value of counter values in the P-phase that have been obtained by multi-sampling (in the example of FIGS. 3A and 3B, two samplings), and hereinafter, processing for obtaining the pixel value data according to the second driving method is appropriately referred to as P-phase averaging processing.

Figures 3A, 3B:
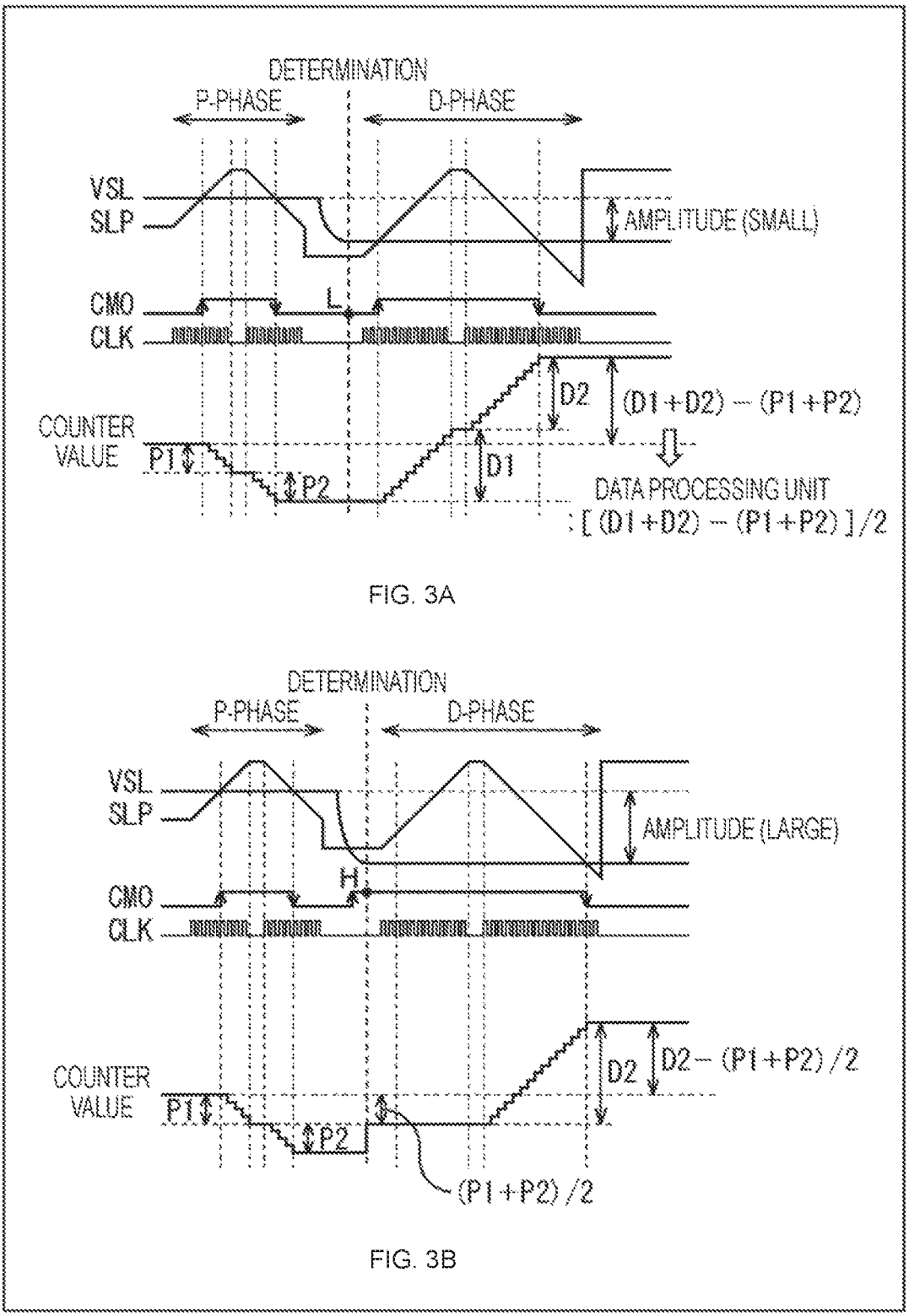
FIGS. 3A and 3B are diagrams explaining a second driving method of the imaging element.

FIG. 3A illustrates a potential VSL having a small amplitude of the vertical signal line 23 in a case where light received by the pixel 21 is dim, similarly to FIG. 2A, and the comparator 25 and the counter 27 operate similarly to the description above given with reference to FIG. 2A.

FIG. 3B illustrates a potential VSL having a large amplitude of the vertical signal line 23 in a case where light received by the pixel 21 is bright, similarly FIG. 2B. Furthermore, in a case where light received by the pixel 21 is bright, in the P-phase, the comparator 25 and the counter 27 perform operations that are similar to operations in a case where light received by the pixel 21 is dim, and therefore the description thereof is omitted.

Then, in a case where light received by the pixel 21 is bright, an H-level determination signal G is held in the signal determination latch 26, and the counter 27 performs processing for setting the number of samplings in the D-phase to one.

In other words, the counter 27 stops counting during a period in which the reference signal SLP has the first D-phase slope, and does not sample the potential VSL of the vertical signal line 23. Then, in the second driving method, the data holding latch 28 shifts a current counter value to a mean value (=(P1+P2)/2) of the counter value P1 in the first P-phase and the counter value P2 in the second P-phase.

Then, when the second D-phase slope starts, the counter 27 starts counting-up. At this time, in the second driving method, in contrast to the first driving method described above with reference to FIGS. 2A and 2B, counting-up is performed by using a normal counter width that is the same as the counter width in the P-phase.

Thereafter, at a timing at which the reference signal SLP having the second D-phase slope falls at a constant gradient to become less than a potential VSL of the signal level of the vertical signal line 23, the comparison result signal CMO output from the comparator 25 is switched from the H-level to the L-level. Accordingly, from the start of the second D-phase slope to this timing, the counter 27 performs counting-up and samples the potential VSL of the vertical signal line 23, obtains the counter value D2 in the second D-phase, and causes the data holding latch 28 to hold the counter value D2.

As described above, in a case where light received by the pixel 21 is bright, the counter 27 performs sampling in the P-phase twice and performs sampling in the D-phase once. Then, in the data holding latch 28, pixel value data (=D2−(P1+P2)/2) is obtained in such a manner that a mean value of the counter value P1 in the first P-phase and the counter value P2 in the second P-phase is subtracted from the counter value D2 in the second D-phase.

Note that, in the second driving method, in the data processing unit 18, processing for reducing pixel value data in a case where light received by the pixel 21 is dim to ½ (=[(D1+D2)−(P1+P2)]/2) is performed in order to match the pixel value data with pixel value data in a case where light received by the pixel 21 is bright.

As described above, in the second driving method, similarly to the first driving method, the imaging element 11 switchingly performs processing for performing the same number of samplings in the D-phase as the number of samplings in the P-phase and processing for performing sampling in the D-phase only once in accordance with the brightness of light received by the pixel 21. At this time, as described above, the imaging element 11 can set a period of the first D-phase slope to a minimum time period required to sample a potential VSL having a small amplitude of the vertical signal line 23. Accordingly, the imaging element 11 can reduce a processing time as a whole of AD conversion processing that is required to perform multi-sampling, and can perform imaging at higher speed.

<Second Configuration Example of Imaging Element>

Figure 4:
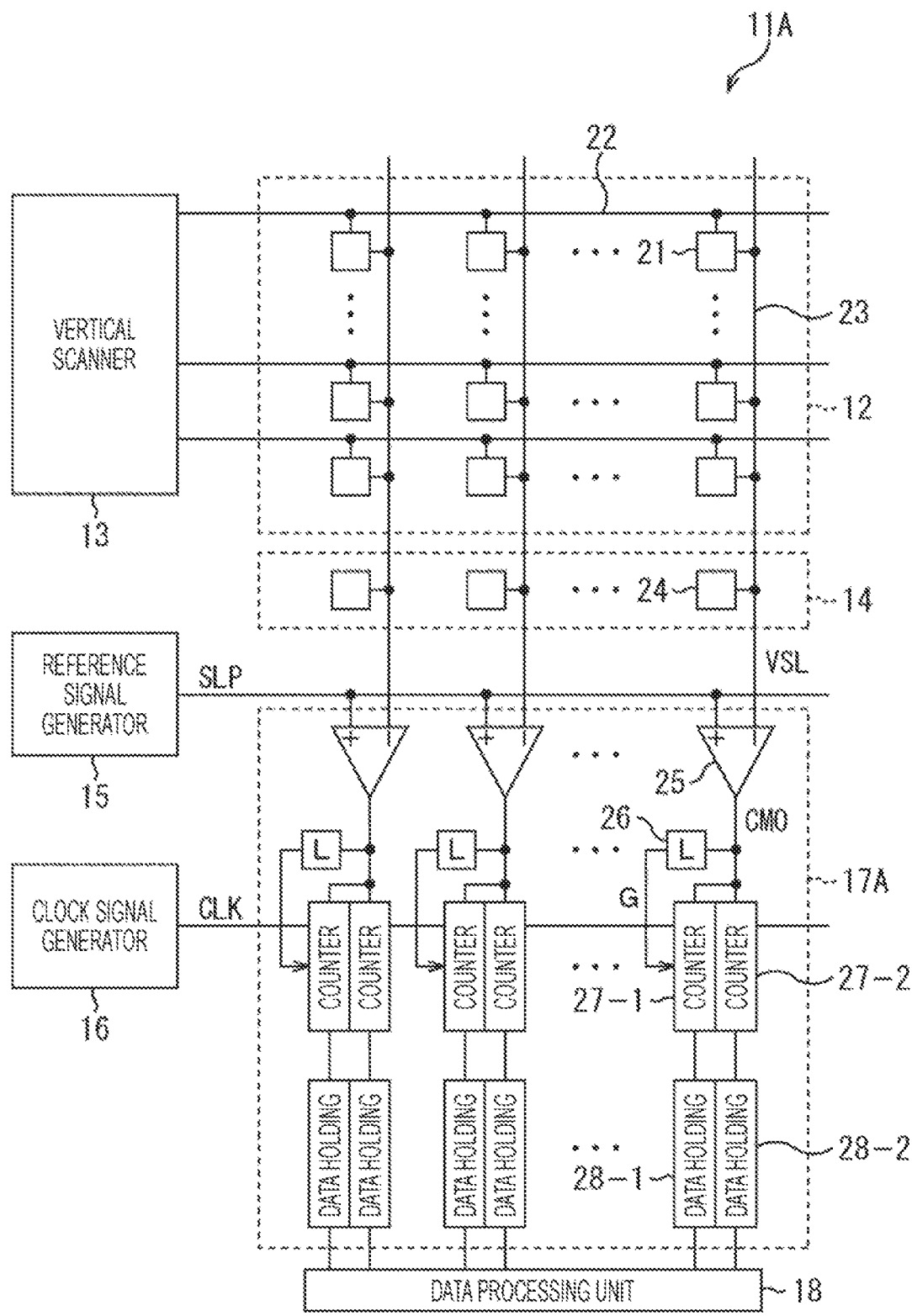
FIG. 4 is a block diagram illustrating a configuration example according to a second embodiment of an imaging element to which the present technology has been applied.

FIG. 4 is a block diagram illustrating a configuration example according to a second embodiment of an imaging element. Note that, in an imaging element 11A illustrated in FIG. 4, the same reference signs are used in a configuration that is common to the configuration of the imaging element 11 of FIG. 1, and the detailed description thereof is omitted.

As illustrated in FIG. 4, the imaging element 11A includes a pixel array 12, a vertical scanner 13, a reading current controller 14, a reference signal generator 15, a clock signal generator 16, and a data processing unit 18, similarly to the imaging element 11 of FIG. 1. Then, in the imaging element 11A, a column-parallel ADC 17A has a configuration that is different from the configuration of the column-parallel ADC 17 in the imaging element 11 of FIG. 1.

In other words, the column-parallel ADC 17A includes a prescribed number of sets of a comparator 25, a signal determination latch 26, two counters 27-1 and 27-2, and two data holding latches 28-1 and 28-2 that corresponds to the number of columns of pixels 21 of the pixel array 12. Furthermore, in the column-parallel ADC 17A, the signal determination latch 26 reports a held determination signal G to the counter 27-1.

The counter 27-1 switches the number of samplings in the D-phase in accordance with the determination signal G reported from the signal determination latch 26 between a case where light received by the pixel 21 is bright and a case where light received by the pixel 21 is dim (not bright). Specifically, the counter 27-1 samples the counter value P1 in the first P-phase and the counter value D2 in the second D-phase in a case where light received by the pixel 21 is dim, and the counter 27-1 only samples the counter value P1 in the first P-phase in a case where light received by the pixel 21 is bright.

The counter 27-2 samples the counter value P2 in the second P-phase and the counter value D2 in the second D-phase.

The data holding latch 28-1 holds pixel value data obtained by the counter 27-1, and the data holding latch 28-2 holds pixel value data obtained by the counter 27-2.

The imaging element 11A is configured as described above, and can reduce random noise such as quantization noise or circuit noise in AD conversion by performing multi-sampling in the column-parallel ADC 17A. Then, in the imaging element 11A, similarly to the imaging element 11 of FIG. 1, a sampling interval of sampling in the D-phase can be reduced, and imaging can be performed at higher speed.

Furthermore, the imaging element 11A is configured to use both the count values of the counter 27-1 and the counter 27-2 in a case where light received by the pixel 21 is dim and to only use the count value of the counter 27-2 in a case where light received by the pixel 21 is bright. Accordingly, for example, also in a case where multi-sampling is performed four times, the imaging element 11A can be similarly configured to use both the count values of the counter 27-1 and the counter 27-2 in a case where light received by the pixel 21 is dim and to only use the count value of the counter 27-2 in a case where light received by the pixel 21 is bright. In other words, the imaging element 11A can sample counter values P1 to P3 and counter values D1 to D3 by using the counter 27-1, and can sample a counter value P4 and a counter value D4 by using the counter 27-2. At this time, the counter value ((D1+D2+D3)−(P1+P2+P3)) is held in the data holding latch 28-1, and the counter value ((D4-P4)) is held in the data holding latch 28-2.

As described above, if the imaging element 11A includes at least two counters 27 and two data holding latches 28-1 for each of the columns of the pixels 21 of the pixel array 12, the imaging element 11A can handle two or more multi-samplings.

<Third Driving Method>

A third driving method performed by the imaging element 11A is described with reference to FIGS. 5A and 5B.

Figures 5A, 5B:
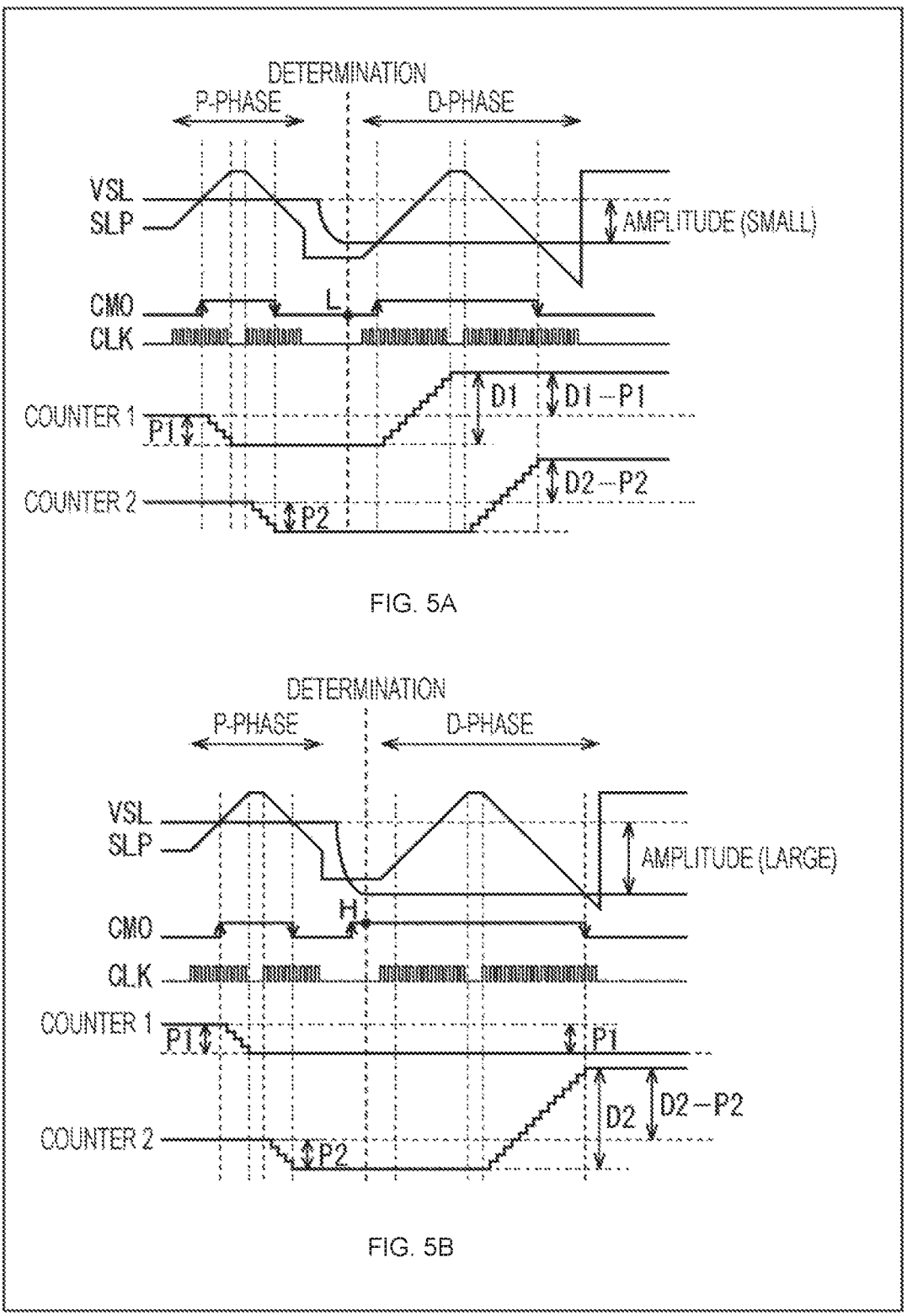
FIGS. 5A and 5B are diagrams explaining a third driving method of the imaging element.

As illustrated in FIGS. 5A and 5B, the reference signal SLP generated by the reference signal generator 15 and the clock signal CLK generated by the clock signal generator 16 respectively have waveforms that are similar to waveforms in the first driving method described with reference to FIG. 4.

As illustrated in FIG. 5A, in a case where light received by the pixel 21 is dim and the amplitude of the potential VSL of the vertical signal line 23 is small, first, in the P-phase, the counter 27-1 performs counting-down and obtains the counter value P1 in the first P-phase, and causes the data holding latch 28-1 to hold the counter value P1. Similarly, the counter 27-2 performs counting-down and obtains the counter value P2 in the second P-phase, and causes the data holding latch 28-2 to hold the counter value P2.

Thereafter, in the D-phase, the counter 27-1 performs counting-up and obtains the counter value D1 in the first D-phase, and causes the data holding latch 28-1 to hold the counter value D1. Similarly, the counter 27-2 performs counting-up and obtains the counter value D2 in the second D-phase, and causes the data holding latch 28-2 to hold the counter value D2.

Accordingly, in this case, in the data holding latch 28-1, a value (=D1-P1) is obtained in such a manner that the counter value P1 in the first P-phase is subtracted from the counter value D1 in the first D-phase. Similarly, in the data holding latch 28-2, a value (=D2-P2) is obtained in such a manner that the counter value P2 in the second P-phase is subtracted from the counter value D2 in the second D-phase.

Furthermore, as illustrated in FIG. 5B, in a case where light received by the pixel 21 is bright and the amplitude of the potential VSL of the vertical signal line 23 is large, in the P-phase, the comparator 25 and the counters 27-1 and 27-2 perform operations that are similar to operations in a case where light received by the pixel 21 is dim, and therefore the description thereof is omitted.

Then, in the third driving method performed by the imaging element 11A, in the P-phase, the counter 27-1 stops counting, and does not sample the potential VSL of the vertical signal line 23. Accordingly, the counter 27-1 keeps holding the counter value P1 in the first P-phase. Note that the counter value P1 in the first P-phase is not used in processing that follows, and therefore the counter 27-1 does not need to output the counter value P1 in the first P-phase.

Furthermore, the counter 27-2 stops counting during a period in which the reference signal SLP has the first D-phase slope, and does not sample the potential VSL of the vertical signal line 23, and a current counter value is maintained in the data holding latch 28-2. Thereafter, when the second D-phase slope starts, the counter 27-2 starts counting-up. Then, until a timing at which a reference signal SLP having the second D-phase slope falls at a constant gradient to become less than a potential VSL of the signal level of the vertical signal line 23, the counter 27-2 performs counting-up and samples the potential VSL of the vertical signal line 23, obtains the counter value D2 in the second D-phase, and causes the data holding latch 28 to hold the counter value D2. Accordingly, in the data holding latch 28-2, a value (=D2-P2) is obtained in such a manner that the counter value P2 in the second P-phase is subtracted from the counter value D2 in the second D-phase.

As described above, in the third driving method, similarly to the first and second driving methods, the imaging element 11A switchingly performs processing for performing the same number of samplings in the D-phase as the number of samplings in the P-phase and processing for performing sampling in the D-phase only once in accordance with the brightness of light received by the pixel 21.

Furthermore, in the imaging element 11A, in a case where light received by the pixel 21 is bright, the data processing unit 18 reads the value (=D1-P1) held by the data holding latch 28-1 and the value (=D2-P2) held by the data holding latch 28-2, and calculates pixel value data (=(D1+D2)−(P1+P2)). On the other hand, in the imaging element 11A, in a case where light received by the pixel 21 is dim, the data processing unit 18 obtains the value (=D2-P2) held by the data holding latch 28-2 as pixel value data.

Then, the imaging element 11A can set the period of the first D-phase slope to a minimum time period required to sample a potential VSL having a small amplitude of the vertical signal line 23, similarly to the imaging element 11 described above. Accordingly, the imaging element 11A can reduce a processing time as a whole of AD conversion processing that is required to perform multi-sampling, and can perform imaging at higher speed.

<Examples of Slope Signal>

Examples of a slope signal used in the imaging element 11 are described with reference to FIGS. 6A, 6B, 7A, 7B, 8A, and 8B.

Figure 6A:
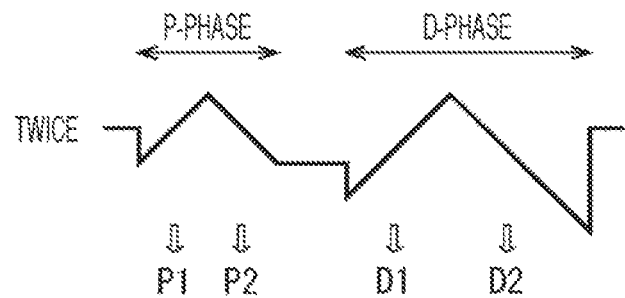
FIGS. 6A and 6B illustrate a first example of a slope signal.
Figure 6B:
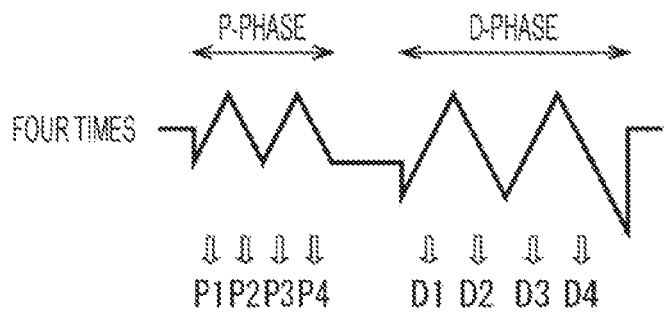

FIGS. 6A and 6B illustrate, as a first example of the slope signal, a slope signal that has slopes folded in a mountain shape, uses odd-numbered slopes in which AD conversion is performed while a voltage value is being raised, and uses even-numbered slopes in which AD conversion is performed while a voltage is being lowered.

FIG. 6A illustrates a slope signal at a time when the P-phase and the D-phase are sampled twice. Note that the first example of the slope signal has the same waveform as the waveform of the slope signal illustrated in FIGS. 2A and 2B.

In other words, the slope signal has, in the P-phase, a first P-phase slope in which AD conversion is performed while a voltage value is being raised and a second P-phase slope in which AD conversion is performed while the voltage value is being lowered. Furthermore, the slope signal has, in the D-phase, a first D-phase slope in which AD conversion is performed while the voltage value is being raised and a second D-phase slope in which AD conversion is performed while the voltage value is being lowered.

Accordingly, in the P-phase, a counter value P1 in the first P-phase is obtained by using the first P-phase slope, and a counter value P2 in the second P-phase is obtained by using the second P-phase slope. Furthermore, in the D-phase, a counter value D1 in a first D-phase is obtained by using the first D-phase slope, and a counter value D2 in a second D-phase is obtained by using the second D-phase slope.

Then, in a case where light received by the pixel 21 is dim, both the imaging element 11 of FIG. 1 and the imaging element 11A of FIG. 4 obtain pixel value data (=(D1+D2)−(P1+P2)).

On the other hand, in a case where light received by the pixel 21 is bright, the number of samplings in the D-phase is set to one, and only the counter value D2 in the second D-phase is obtained. Accordingly, the imaging element 11 of FIG. 1 obtains pixel value data (=D2-(P1+P2)/2), and the imaging element 11A of FIG. 4 obtains pixel value data (=D2-P2).

FIG. 6B illustrates a slope signal at a time when the P-phase and the D-phase are sampled four times.

In other words, the slope signal has, in the P-phase, a first P-phase slope in which AD conversion is performed while the voltage value is being raised, a second P-phase slope in which AD conversion is performed while the voltage value is being lowered, a third P-phase slope in which AD conversion is performed while the voltage value is being raised, and a fourth P-phase slope in which AD conversion is performed while the voltage value is being lowered. Furthermore, the slope signal has, in the D-phase, a first D-phase slope in which AD conversion is performed while the voltage value is being raised, a second D-phase slope in which AD conversion is performed while the voltage value is being lowered, a third D-phase slope in which AD conversion is performed while the voltage value is being raised, and a fourth D-phase slope in which AD conversion is performed while the voltage value is being lowered.

Accordingly, a counter value P1 in a first P-phase is obtained by using the first P-phase slope, a counter value P2 in a second P-phase is obtained by using the second P-phase slope, a counter value P3 in a third P-phase is obtained by using the third P-phase slope, and a counter value P4 in a fourth P-phase is obtained by using the fourth P-phase slope. Furthermore, a counter value D1 in a first D-phase is obtained by using the first D-phase slope, a counter value D2 in a second D-phase is obtained by using the second D-phase slope, a counter value D3 in a third D-phase is obtained by using the third D-phase slope, and a counter value D4 in a fourth D-phase is obtained by using the fourth D-phase slope.

Then, in a case where light received by the pixel 21 is dim, both the imaging element 11 of FIG. 1 and the imaging element 11A of FIG. 4 obtain pixel value data (=(D1+D2+D3+D4)−(P1+P2+P3+P4)).

On the other hand, in a case where light received by the pixel 21 is bright, the number of samplings in the D-phase is set to one, and only the counter value D4 in the fourth D-phase is obtained. Accordingly, the imaging element 11 of FIG. 1 obtains pixel value data (=D4−(P1+P2+P3+P4)/4), and the imaging element 11A of FIG. 4 obtains pixel value data (=D4−P4).

Figure 7A:
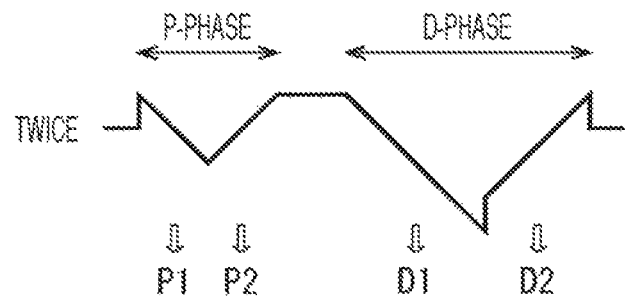
FIGS. 7A and 7B illustrate a second example of the slope signal.
Figure 7B:
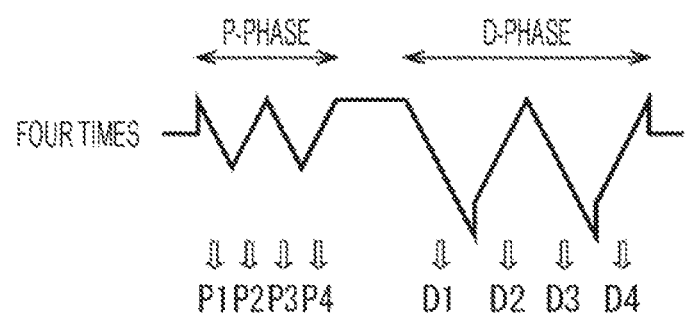

FIGS. 7A and 7B illustrate, as a second example of the slope signal, a slope signal that has slopes folded in a valley shape, uses odd-numbered slopes in which AD conversion is performed while the voltage value is being lowered, and uses even-numbered slopes in which AD conversion is performed while the voltage is being raised.

FIG. 7A illustrates a slope signal at a time when the P-phase and the D-phase are sampled twice.

In other words, the slope signal has, in the P-phase, a first P-phase slope in which AD conversion is performed while the voltage value is being lowered and a second P-phase slope in which AD conversion is performed while the voltage value is being raised. Furthermore, the slope signal has, in the D-phase, a first D-phase slope in which AD conversion is performed while the voltage value is being lowered and a second D-phase slope in which AD conversion is performed while the voltage value is being raised.

FIG. 7B illustrates a slope signal at a time when the P-phase and the D-phase are sampled four times.

In other words, the slope signal has, in the P-phase, a first P-phase slope in which AD conversion is performed while the voltage value is being raised, a second P-phase slope in which AD conversion is performed while the voltage value is being lowered, a third P-phase slope in which AD conversion is performed while the voltage value is being raised, and a fourth P-phase slope in which AD conversion is performed while the voltage value is being lowered. Furthermore, the slope signal has, in the D-phase, a first D-phase slope in which AD conversion is performed while the voltage value is being raised, a second D-phase slope in which AD conversion is performed while the voltage value is being lowered, a third D-phase slope in which AD conversion is performed while the voltage value is being raised, and a fourth D-phase slope in which AD conversion is performed while the voltage value is being lowered.

Then, by using the slope signal illustrated in FIGS. 7A and 7B, the imaging element 11 of FIG. 1 and the imaging element 11A of FIG. 4 can obtain pixel value data similarly to the description given with reference to FIGS. 6A and 6B.

Figure 8A:
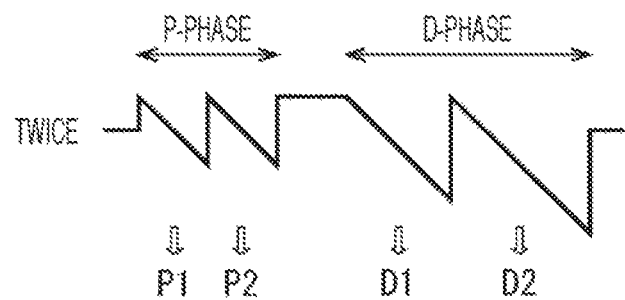
FIGS. 8A and 8B illustrate a third example of the slope signal.
Figure 8B:
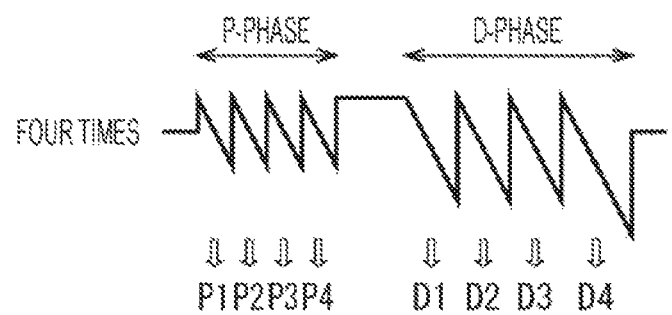

FIGS. 8A and 8B illustrate, as a third example of the slope signal, a slope signal by which AD conversion is performed while the voltage is being lowered in all of the slopes.

FIG. 8A illustrates a slope signal at a time when the P-phase and the D-phase are sampled twice.

In other words, the slope signal has, in the P-phase, a first P-phase slope in which AD conversion is performed while the voltage value is being lowered and a second P-phase slope in which AD conversion is performed while the voltage value is being lowered. Furthermore, the slope signal has, in the D-phase, a first D-phase slope in which AD conversion is performed while the voltage value is being lowered and a second D-phase slope in which AD conversion is performed while the voltage value is being lowered.

FIG. 8B illustrates a slope signal at a time when the P-phase and the D-phase are sampled four times.

In other words, the slope signal has, in the P-phase, a first P-phase slope in which AD conversion is performed while the voltage value is being lowered, a second P-phase slope in which AD conversion is performed while the voltage value is being lowered, a third P-phase slope in which AD conversion is performed while the voltage value is being lowered, and a fourth P-phase slope in which AD conversion is performed while the voltage value is being lowered. Furthermore, the slope signal has, in the D-phase, a first D-phase slope in which AD conversion is performed while the voltage value is being lowered, a second D-phase slope in which AD conversion is performed while the voltage value is being lowered, a third D-phase slope in which AD conversion is performed while the voltage value is being lowered, and a fourth D-phase slope in which AD conversion is performed while the voltage value is being lowered.

Then, by using the slope signal illustrated in FIGS. 8A and 8B, the imaging element 11 of FIG. 1 and the imaging element 11A of FIG. 4 can obtain pixel value data similarly to the description given with reference to FIGS. 6A and 6B.

Note that the waveform of the slope signal is not limited to the examples described above, and a slope signal by which AD conversion is performed while the voltage is being raised in all of the slopes or a slope signal by which the P-phase and the D-phase are sampled four times or more may be used, for example. Furthermore, the number of slopes for the sampling of the P-phase may be different from the number of slops for the sampling of the D-phase.

In other words, the slope signal may have any waveform, if a sampling period of the D-phase during which sampling is performed when light received by the pixel 21 is bright is set to be long, and a sampling period of the D-phase at the other time is set to a minimum time period required to sample a potential VSL having a small amplitude of the vertical signal line 23.

Furthermore, in the respective embodiments described above, it has been described that the number of samplings in the D-phase is one in a case where light received by the pixel 21 is bright, but a processing time of AD conversion processing performed on a pixel signal can be reduced, for example, if the number of samplings in the D-phase is less than the number of samplings in the P-phase. In other words, for example, in a case where multi-sampling is performed four times, the imaging element 11 may be configured to sample the P-phase four times and sample the D-phase twice when light received by the pixel 21 is bright.

Note that the imaging element 11 described above can be applied to various types of electronic equipment, e.g., an imaging system such as a digital still camera, a digital video camera, or the like, a mobile phone having an imaging function, or other equipment having the imaging function.

<Configuration Example of Imaging Apparatus>

Figure 9:
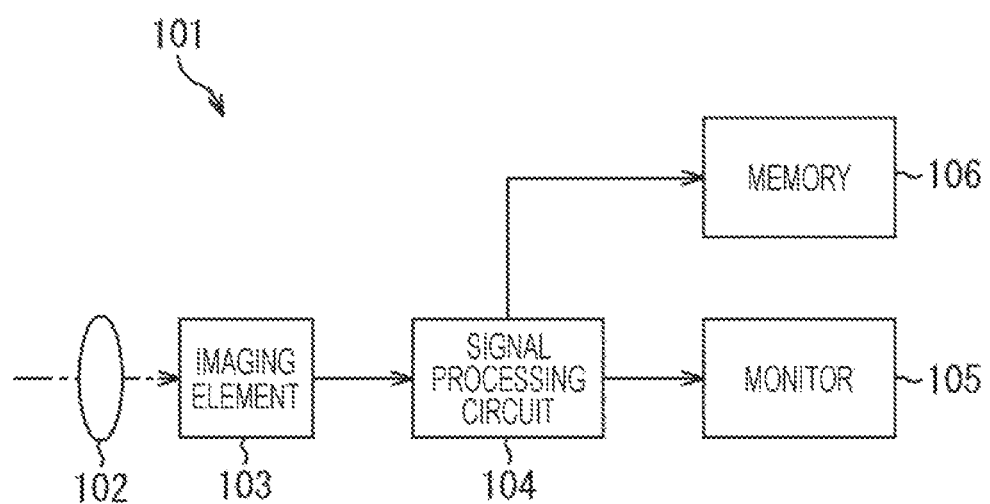
FIG. 9 is a block diagram illustrating a configuration example of an imaging apparatus.

FIG. 9 is a block diagram illustrating a configuration example of an imaging apparatus that is mounted on electronic equipment.

As illustrated in FIG. 9, an imaging apparatus 101 includes an optical system 102, an imaging element 103, a signal processing circuit 104, a monitor 105, and a memory 106, and can capture a still image and a moving image.

The optical system 102 includes one or a plurality of lenses, guides image light (incident light) from a subject to the imaging element 103, and causes an image to be formed on a light receiving surface (a sensor) of the imaging element 103.

As the imaging element 103, the imaging element 11 described above is applied. In the imaging element 103, electrons are accumulated according to the image that has been formed on the light receiving surface via the optical system 102 during a prescribed period. Then, a signal according to the electrons accumulated in the imaging element 103 is supplied to the signal processing circuit 104.

The signal processing circuit 104 performs various types of signal processing on a pixel signal that has been output from the imaging element 103. An image (image data) that has been obtained by the signal processing circuit 104 performing signal processing is supplied to the monitor 105 and is displayed on the monitor 105, or is supplied to the memory 106 and is stored (recorded) in the memory 106.

By applying the imaging element 11 described above to the imaging apparatus 101 configured as described above, an image having less noise can be captured, for example, at high speed.

<Usage Example of Image Sensor>

Figure 10:
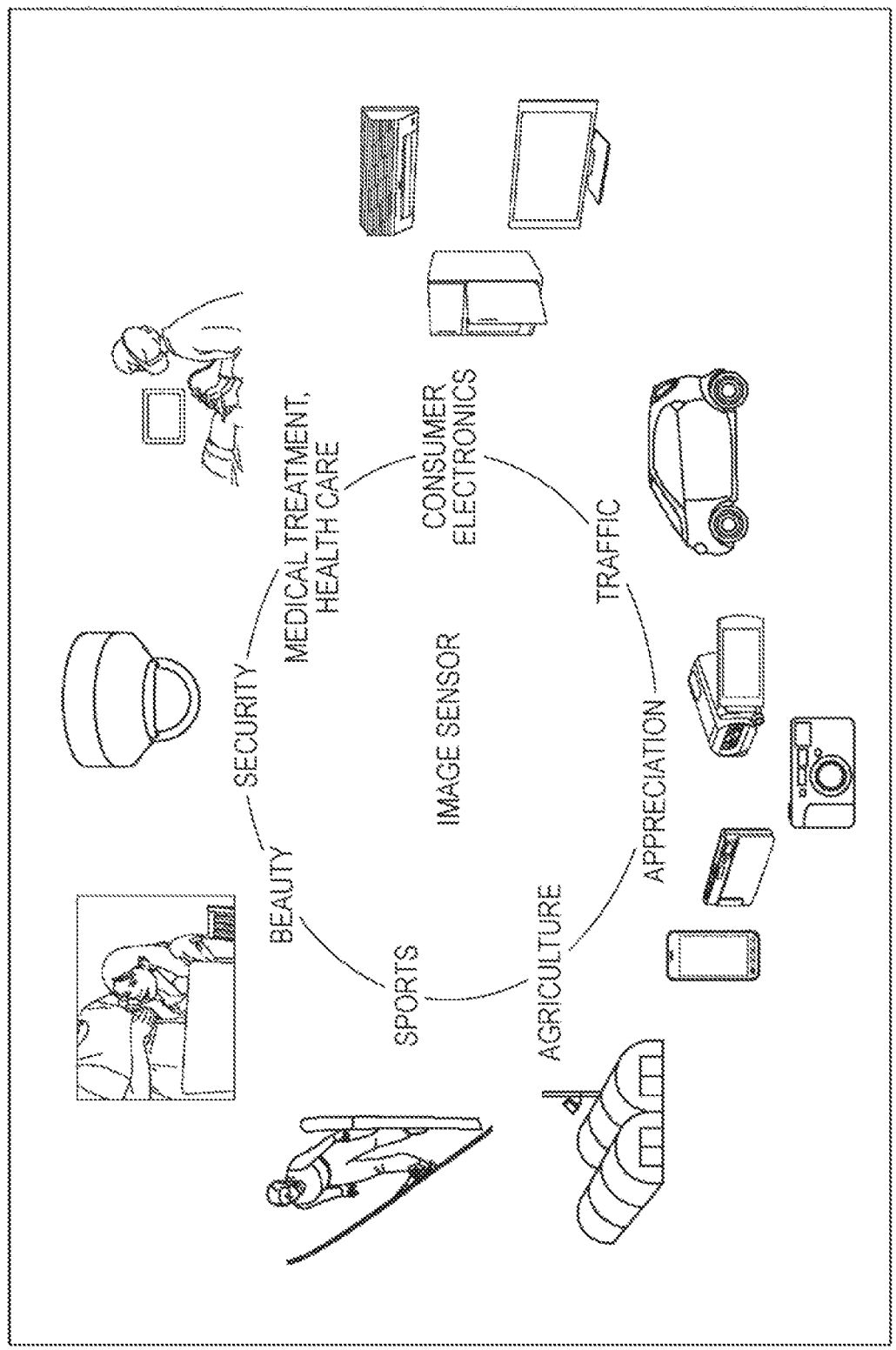
FIG. 10 illustrates a usage example in which an image sensor is used.

FIG. 10 illustrates a usage example in which the image sensor described above is used.

The image sensor described above can be used, for example, in various cases where light such as visible light, infrared light, ultraviolet light, or X-rays is sensed, as described below.

- Apparatuses that photograph an image provided for appreciation, such as digital cameras or portable equipment having a camera function
- Apparatuses that are provided for traffic, such as on-vehicle sensors that photograph a front side, a rear side, the periphery, the inside, or the like of an automobile for the purpose of safe driving such as automatic stop, the recognition of the state of a driver, or the like, monitoring cameras that monitor travelling vehicles or roads, or ranging sensors that measure a distance between vehicles or the like
- Apparatuses that are provided in consumer electronics, such as TVs, refrigerators, or air conditioners, in order to photograph a user's gesture and operate equipment in accordance with the gesture
- Apparatuses that are provided for medical treatment or health care, such as endoscopes or apparatuses that perform angiography by receiving infrared light
- Apparatuses that are provided for security, such as monitoring cameras for crime prevention or cameras for personal authentication
- Apparatuses that are provided for beauty, such as skin measuring devices that photograph skin or microscopes that photograph a scalp
- Apparatuses that are provided for sports, such as action cameras or wearable cameras for sport usage or the like
- Apparatuses that are provided for agriculture, such as cameras that monitor the state of fields or crops Note that the present technology can also employ the configuration described below.

(1)

An imaging element including:

a pixel array in which a plurality of pixels are arranged in a matrix shape;

an analog-to-digital (AD) converter that performs AD conversion in parallel on pixel signals that have been output from the plurality of pixels for each column of the plurality of pixels arranged in the pixel array; and a reference signal generator that generates a reference signal that the AD converter refers to when the AD converter performs the AD conversion on the pixel signals, the reference signal having a waveform that includes a slope having a constant gradient, in which when the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

(2)

The imaging element according to (1) described above, in which the AD converter performs the AD conversion on the pixel signals while switching, for each of the columns of the plurality of pixels, first processing for setting the number of samplings during the D-phase period to be equal to the number of samplings during the P-phase period and second processing for setting the number of samplings during the D-phase period to be less than the number of samplings during the P-phase period.

(3)

The imaging element according to (2) described above, in which the AD converter performs the first processing in a case where light received by the pixel that is a target for the AD conversion is dim, and performs the second processing in a case where the light received by the pixel that is the target for the AD conversion is bright.

(4)

The imaging element according to (2) or (3) described above, in which the sampling period of the first slope is set to a time period required to perform the AD conversion on a pixel signal at a time when the pixel receives bright light, and the sampling period of the second slope is set to a time period required to perform the AD conversion on a pixel signal at a time when the pixel receives dim light.

(5)

The imaging element according to any of (2) to (4) described above, in which the AD converter includes, for each of the columns of the plurality of pixels arranged in the pixel array:

a comparator that compares the pixel signal that has been supplied from the pixel with the reference signal that has been supplied from the reference signal generator;

a signal determination holding unit that holds a determination signal indicating whether or not the light received by the pixel is bright on the basis of a comparison result of the comparator; and a counter that samples the pixel signal by counting a clock signal having a prescribed clock frequency, and the counter samples the pixel signal while switching the first processing and the second processing in accordance with the determination signal held by the signal determination holding unit.

(6)

The imaging element according to (5) described above,
in which the AD converter further includes a data holding unit that holds a counter value that has been output from the counter, for each of the columns of the plurality of pixels arranged in the pixel array.

(7)

The imaging element according to (5) or (6) described above,
in which in a case where the light received by the pixel is bright, the counter stops sampling during the sampling period of the second slope in the D-phase period, and performs the sampling using a prescribed integral multiple of a counter width during the sampling period of the first slope, the prescribed integral multiple corresponding to the number of multi-samplings.

(8)

The imaging element according to (6) described above,
in which in a case where the light received by the pixel is bright, the counter stops sampling during the sampling period of the second slope in the D-phase period, the data holding unit holds a value that has been shifted to a mean value of counter values that have been obtained during a plurality of sampling periods, and the counter performs the sampling using a normal counter width during the sampling period of the first slope.

(9)

The imaging element according to any of (6) to (8) described above,
in which the AD converter includes at least two sets of the counter and the data holding unit for each of the columns of the plurality of pixels arranged in the pixel array, and
one counter of the at least two sets of the counter and the data holding unit performs the AD conversion on the pixel signal while switching the first processing and the second processing in accordance with the determination signal held by the signal determination holding unit.

(10)

The imaging element according to (5) described above, further including:
a data processing unit that performs data processing based on the counter value that has been output from the counter,
in which the counter outputs, to the data processing unit, counter values obtained by performing sampling during the P-phase period and the D-phase period, and
the data processing unit performs data processing for calculating pixel value data from the counter values.

(11)

The imaging element according to any of (1) to (10) described above,
in which the reference signal generator generates a slope signal that is folded in a mountain shape, the slope signal including an odd-numbered slope in which the AD conversion is performed while a voltage value is being raised and an even-numbered slope in which the AD conversion is performed while a voltage is being lowered.

(12)

The imaging element according to any of (1) to (10) described above,
in which the reference signal generator generates a slope signal that is folded in a valley shape, the slope signal including an odd-numbered slope in which the AD conversion is performed while a voltage value is being lowered and an even-numbered slope in which the AD conversion is performed while a voltage is being raised.

(13)

The imaging element according to any of (1) to (10) described above,
in which the reference signal generator generates a slope signal by which the AD conversion is performed while a voltage is being lowered in all slopes.

(14)

A driving method of an imaging element, the imaging element including:
a pixel array in which a plurality of pixels are arranged in a matrix shape;
an analog-to-digital (AD) converter that performs AD conversion in parallel on pixel signals that have been output from the plurality of pixels for each column of the plurality of pixels arranged in the pixel array; and
a reference signal generator that generates a reference signal that the AD converter refers to when the AD converter performs the AD conversion on the pixel signals, the reference signal having a waveform that includes a slope having a constant gradient,
in which when the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels,
the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

(15)

Electronic equipment including:
an imaging element that includes:
a pixel array in which a plurality of pixels are arranged in a matrix shape;
an analog-to-digital (AD) converter that performs AD conversion in parallel on pixel signals that have been output from the plurality of pixels for each column of the plurality of pixels arranged in the pixel array; and
a reference signal generator that generates a reference signal that the AD converter refers to when the AD converter performs the AD conversion on the pixel signals, the reference signal having a waveform that includes a slope having a constant gradient,
in which when the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels,
the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

Note that the present embodiments are not limited to the embodiments described above, and various changes can be made without departing from the scope of the present disclosure.

REFERENCE SIGNS LIST

11 Imaging element
12 Pixel array
13 Vertical scanner
14 Reading current controller
15 Reference signal generator
16 Clock signal generator
17 Column-parallel ADC
18 Data processing unit
21 Pixel
22 Horizontal signal line
23 Vertical signal line
24 Current source circuit
25 Comparator
26 Signal determination latch
27 Counter
28 Data holding latch

The invention claimed is:

1. An imaging element comprising:
a pixel array in which a plurality of pixels are arranged in a matrix shape;
an analog-to-digital (AD) converter that performs AD conversion in parallel on pixel signals that have been output from the plurality of pixels for each column of the plurality of pixels arranged in the pixel array; and
a reference signal generator that generates a reference signal that the AD converter refers to when the AD converter performs the AD conversion on the pixel signals, the reference signal having a waveform that includes a slope having a constant gradient,
wherein when the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, and
the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

2. The imaging element according to claim 1,
wherein the AD converter performs the AD conversion on the pixel signals while switching, for each of the columns of the plurality of pixels, first processing for setting a number of samplings during the D-phase period to be equal to a number of samplings during the P-phase period and second processing for setting the number of samplings during the D-phase period to be less than the number of samplings during the P-phase period.

3. The imaging element according to claim 2,
wherein the AD converter performs the first processing in a case where the light received by a pixel of the plurality of pixels that is a target for the AD conversion is dim, and performs the second processing in a case where the light received by the pixel that is the target for the AD conversion is bright.

4. The imaging element according to claim 3,
wherein the sampling period of the first slope is set to a time period required to perform the AD conversion on a pixel signal at a time when the pixel receives bright light, and
the sampling period of the second slope is set to a time period required to perform the AD conversion on a pixel signal at a time when the pixel receives dim light.

5. The imaging element according to claim 2,
wherein the AD converter includes, for each of the columns of the plurality of pixels arranged in the pixel array:
a comparator that compares the pixel signals that have been supplied from the plurality of pixels with the reference signal that has been supplied from the reference signal generator;
a signal determination holding unit that holds a determination signal indicating whether or not the light received by each of the plurality of pixels is bright on the basis of a comparison result of the comparator; and
a counter that samples the pixel signals by counting a clock signal having a prescribed clock frequency, and
the counter samples the pixel signals while switching the first processing and the second processing in accordance with the determination signal held by the signal determination holding unit.

6. The imaging element according to claim 5,
wherein the AD converter further includes a data holding unit that holds a counter value that has been output from the counter, for each of the columns of the plurality of pixels arranged in the pixel array.

7. The imaging element according to claim 5,
wherein in a case where the light received by each of the plurality of pixels is bright, the counter stops sampling during the sampling period of the second slope in the D-phase period, and performs the sampling using a prescribed integral multiple of a counter width during the sampling period of the first slope, the prescribed integral multiple corresponding to a number of multi-samplings.

8. The imaging element according to claim 6,
wherein in a case where the light received by each of the plurality of pixels is bright, the counter stops sampling during the sampling period of the second slope in the D-phase period, the data holding unit holds a value that has been shifted to a mean value of counter values that have been obtained during a plurality of sampling periods, and the counter performs the sampling using a normal counter width during the sampling period of the first slope.

9. The imaging element according to claim 6,
wherein the AD converter includes at least two sets of the counter and the data holding unit for each of the columns of the plurality of pixels arranged in the pixel array, and
one counter of the at least two sets of the counter and the data holding unit performs the AD conversion on the pixel signals while switching the first processing and the second processing in accordance with the determination signal held by the signal determination holding unit.

10. The imaging element according to claim 5, further comprising:
a data processing unit that performs data processing based on a counter value that has been output from the counter, wherein
the counter outputs, to the data processing unit, counter values obtained by performing sampling during the P-phase period and the D-phase period, and
the data processing unit performs data processing for calculating pixel value data from the counter values.

11. The imaging element according to claim 1, wherein the reference signal generator generates a slope signal that is folded in a mountain shape, the slope signal including an odd-numbered slope in which the AD conversion is performed while a voltage value is being raised and an even-numbered slope in which the AD conversion is performed while a voltage is being lowered.

12. The imaging element according to claim 1, wherein the reference signal generator generates a slope signal that is folded in a valley shape, the slope signal including an odd-numbered slope in which the AD conversion is performed while a voltage value is being lowered and an even-numbered slope in which the AD conversion is performed while a voltage is being raised.

13. The imaging element according to claim 1, wherein the reference signal generator generates a slope signal by which the AD conversion is performed while a voltage is being lowered in all slopes.

14. A driving method of an imaging element, the imaging element including:
a pixel array in which a plurality of pixels are arranged in a matrix shape;
an analog-to-digital (AD) converter that performs AD conversion in parallel on pixel signals that have been output from the plurality of pixels for each column of the plurality of pixels arranged in the pixel array; and
a reference signal generator that generates a reference signal that the AD converter refers to when the AD converter performs the AD conversion on the pixel signals, the reference signal having a waveform that includes a slope having a constant gradient,
wherein when the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, and
the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

15. An electronic equipment, comprising:
an imaging element that includes:
a pixel array in which a plurality of pixels are arranged in a matrix shape;
an analog-to-digital (AD) converter that performs AD conversion in parallel on pixel signals that have been output from the plurality of pixels for each column of the plurality of pixels arranged in the pixel array; and
a reference signal generator that generates a reference signal that the AD converter refers to when the AD converter performs the AD conversion on the pixel signals, the reference signal having a waveform that includes a slope having a constant gradient,
wherein when the AD converter performs, on an identical pixel signal of the pixel signals, multi-sampling for performing sampling during a P-phase period and sampling during a D-phase period at least once or more, the P-phase period being a period during which the AD conversion is performed on a pixel signal having a reset level of each of the plurality of pixels, the D-phase period being a period during which the AD conversion is performed on a pixel signal having a level that corresponds to an amount of light received by each of the plurality of pixels, and
the reference signal generator generates the reference signal in which, from among a plurality of slopes during the D-phase period, a sampling period of a second slope other than a first slope has been set to be shorter than a sampling period of the first slope, the sampling period of the second slope being a sampling period having a prescribed length.

* * * * *